(12) United States Patent
Castelli et al.

(10) Patent No.: US 11,406,045 B2
(45) Date of Patent: Aug. 2, 2022

(54) HELICOPTER VENTILATION ARCHITECTURE WITH MIXING CHAMBER

(71) Applicant: SAFRAN ELECTRICAL & POWER, Blagnac (FR)

(72) Inventors: Christophe Castelli, Blagnac (FR); Fabien Del Rio, Blagnac (FR); Florent Challas, Blagnac (FR); Jean Manel-Delaleux, Blagnac (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 409 days.

(21) Appl. No.: 16/630,826

(22) PCT Filed: Jul. 10, 2018

(86) PCT No.: PCT/FR2018/051735
§ 371 (c)(1),
(2) Date: Jan. 13, 2020

(87) PCT Pub. No.: WO2019/016444
PCT Pub. Date: Jan. 24, 2019

(65) Prior Publication Data
US 2020/0146184 A1    May 7, 2020

(30) Foreign Application Priority Data

Jul. 20, 2017    (FR) ...................................... 1756899

(51) Int. Cl.
*H05K 7/14*    (2006.01)
*H05K 7/20*    (2006.01)
(Continued)

(52) U.S. Cl.
CPC ......... *H05K 7/20572* (2013.01); *B64C 27/04* (2013.01); *B64D 13/006* (2013.01);
(Continued)

(58) Field of Classification Search
CPC ...................... B64D 2013/0614; B64D 13/00; B64C 27/04; H05K 7/20145; H05K 7/20554;
(Continued)

(56) References Cited

U.S. PATENT DOCUMENTS

2013/0082138 A1*    4/2013    Guering ................. B64D 13/00
244/117 R
2016/0325841 A1    11/2016    Beckman et al.

FOREIGN PATENT DOCUMENTS

EP    2574552    4/2013

OTHER PUBLICATIONS

Safran Electrical & Power, "International Search Report," PCT Application No. PCT/FR2018/051735 (dated Nov. 14, 2018).

* cited by examiner

*Primary Examiner* — Mandeep S Buttar
(74) *Attorney, Agent, or Firm* — Womble Bond Dickinson (US) LLP

(57) ABSTRACT

The invention concerns a helicopter ventilation architecture, said helicopter comprising at least two avionics bays (112a, 112b) comprising electronic equipment (116a, 116b) to be ventilated, said architecture comprising, for each avionics bay, an air inlet (120a, 120b) allowing outside air to enter the avionics bay in order to ventilate said avionics bay, and an air outlet (124a, 124b), allowing the air ventilating the avionics bay to exit the avionics bay, characterised in that the ventilation architecture further comprises a mixing chamber (134), connected to the air outlets, configured to receive the air originating from all the avionics bays, at least one air duct (138a, 138b), connected to the mixing chamber and to an outlet (130a, 130b) for discharging the air to the outside, and at least two fans (128a, 128b), arranged and distributed in the air duct or ducts.

6 Claims, 2 Drawing Sheets

Figure 1:
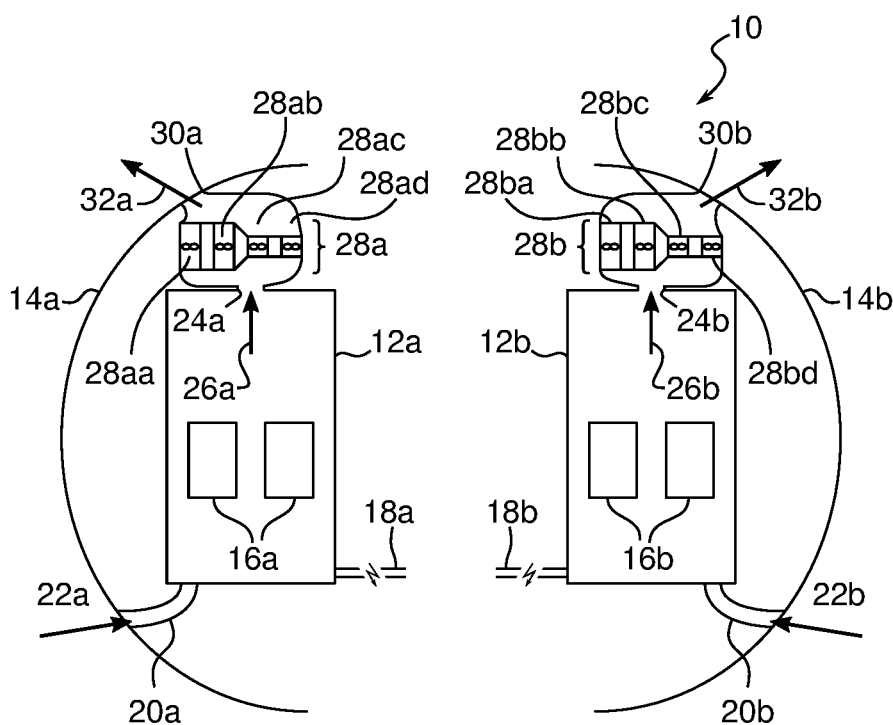

(51) Int. Cl.
*B64C 27/04* (2006.01)
*B64D 13/00* (2006.01)
*B64D 13/06* (2006.01)

(52) U.S. Cl.
CPC ......... *B64D 13/06* (2013.01); *H05K 7/20145* (2013.01); *H05K 7/20172* (2013.01); *H05K 7/20863* (2013.01); *B64D 2013/0614* (2013.01)

(58) Field of Classification Search
CPC ........... H05K 7/20572; H05K 7/20172; H05K 7/20645; H05K 7/20681; G06F 1/20
USPC .................. 361/694, 695, 692; 454/184, 76; 165/104.33
See application file for complete search history.

HELICOPTER VENTILATION ARCHITECTURE WITH MIXING CHAMBER

1. TECHNICAL FIELD OF THE INVENTION

The invention concerns a ventilation architecture of a helicopter. In particular, the invention concerns a ventilation architecture of helicopter avionics bays.

2. TECHNOLOGICAL BACKGROUND

The state of the art comprises, in particular, patent applications EP-A2-2 574 552 and US-A1-2016/325841.

Helicopters comprise at least one avionics bay comprising electronic and/or electric equipment. This electronic equipment requires a ventilation to limit the increase of the temperature thereof, due to the specific operating thereof and/or due to environment constraints wherein the helicopter develops. This ventilation is made by removing the outside air to cool the electronic equipment. This removal and the circulation of the air is done thanks to the presence of one or more fans in a ventilation architecture allowing the bay to be ventilated.

On recent helicopter configurations, the helicopter can comprise two avionics bays, in which case the ventilation must be doubled to allow to ventilate each avionics bay. For redundancy reasons, each ventilation comprises at least two fans to overcome the failure of one of the two fans.

In the scope of stricter and stricter aeronautical requirements for air safety reasons, the presence of one single operating fan per bay is possible during the flight in case of breakdown of the second fan, but a helicopter having one single operating fan per bay will not be authorised to take off again without changing the defective fan.

To avoid this problem, helicopters are frequently equipped with three fans per bay, that is six fans. To allow a better safety in case of electric supply problems, these groups of fans are composed of two types of fans supplied by different supply networks. For example, fans supplied with alternating voltage (typically 115V) and fans supplied with direct voltage (typically 28V).

Thus, the increase of the number and of the type of these fans for safety reasons leads to an increase of the mass, the price, and the electric consumption of the ventilation architecture. In addition, the efficiency of each fan is frequently decreased.

The inventors have therefore sought a solution to these disadvantages.

3. AIMS OF THE INVENTION

The invention aims to overcome at least some of the disadvantages of known helicopter ventilation architectures.

In particular, the invention aims to provide, in at least one embodiment of the invention, a helicopter ventilation architecture reducing the number of fans necessary.

The invention also aims to provide, in at least one embodiment, a helicopter ventilation architecture of reduced mass.

The invention also aims to provide, in at least one embodiment, a helicopter ventilation architecture of lower cost to the current solutions.

The invention also aims to provide, in at least one embodiment, a helicopter ventilation architecture having a reduced electric consumption.

The invention also aims to provide, in at least one embodiment, a helicopter ventilation architecture having a volume necessary for the reduced installation thereof.

The invention also aims to provide, in at least one embodiment of the invention, a helicopter ventilation architecture having an easier maintenance.

The invention also aims to provide, in at least one embodiment, a helicopter ventilation architecture according to the aeronautical requirements required.

The invention also aims to provide, in at least one embodiment, a helicopter ventilation architecture reducing the number of breakdowns encountered and improving reliability.

The invention also aims to provide, in at least one embodiment, a helicopter ventilation architecture improving the availability of the helicopter.

The invention also aims to provide, in at least one embodiment, a helicopter ventilation architecture which could integrate additional functions.

4. SUMMARY OF THE INVENTION

To do this, the invention concerns a helicopter ventilation architecture, said helicopter comprising at least two avionics bays comprising electronic equipment to be ventilated, said architecture comprising, for each avionics bay:
- an air inlet, allowing outside air to enter the avionics bay to ventilate said avionics bay,
- an air outlet, allowing the air ventilating the avionics bay to exit the avionics bay,
characterised in that the ventilation architecture further comprises:
- a mixing chamber, connected to the air outlets, configured to receive air originating from all the avionics bays,
- at least one air duct, connected to the mixing chamber, and to an outlet for discharging the air to the outside,
- at least two fans, arranged and distributed in the air duct(s).

An architecture according to the invention therefore allows, thanks to the mixing chamber, to pool the ventilation of the two avionics bays and to thus reduce by two, the number of embedded fans. The reduced number of fans thus allows for a decrease of the weight, the price, the necessary volume and the electric consumption of the ventilation architecture.

The mixing chamber (also called cooling hub) allows to create a buffer volume allowing the optimal distribution of the air flow between the avionics bays whatever the number of fans initiated. Thus, even if one of the fans is broken down, the two avionics bays will be ventilated in the same manner, thus avoiding having to regulate the load losses at the level of each bay. The mixing chamber is composed of a volume to which is connected the different ducts wherein air circulates. In the simplest form thereof, the mixing chamber can be formed of a tube to which ducts are connected.

The architecture remains compliant with aeronautical requirements, since if a fan breaks down, the avionics bays remain correctly ventilated. In addition, the presence of at least two fans pooled at the bays still allows to conserve a working fan if one breaks down, which allows the helicopter to take off again. The availability of the helicopter is thus increased.

Furthermore, the decrease of the number of fans decreases the number of breakdowns as much as possible and the reliability of the architecture is increased.

Preferably, the helicopter comprises two avionics bays and the ventilation architecture comprises three or four fans.

In this configuration, considering the removal of fans with respect to the architectures of the prior art and of the addition of a mixing chamber and associated ducts:
- the reduction of the mass of the architecture is estimated at 35%,
- the reduction of the electric consumption is estimated at 25%,
- the reduction of the cost is estimated at 45%.

Advantageously and according to a first variant of the invention, the ventilation architecture comprises two air ducts, each air duct comprising at least one fan.

Advantageously and according to a second variant of the invention, the ventilation architecture comprises one single air duct, said single air duct comprising said at least two fans.

According to this variant of the invention, the presence of all of the fans in the same air duct allows to facilitate the maintenance of the ventilation architecture, for example in case of change of a fan, as the fans are all grouped together in the same place. Furthermore, the harnesses and support of the fans are also pooled which reduces the complexity thereof.

Advantageously and according to the invention, the ventilation architecture comprises, among the fans, at least one fan supplied with alternating voltage and at least one fan supplied with direct voltage.

According to this aspect of the invention, the fans supplied by segregated electric networks allow an additional redundancy.

In the first variant of the invention described above, each air duct can, for example, comprise a fan of each type.

In the second variant of the invention described above, the fans are, in any manner, arranged in the same air duct.

According to other variants of the invention, the ventilation architecture only comprises fans supplied with alternating voltage, possibly with different alternating voltages according to the fans, or only fans supplied with direct voltage, possibly with different direct voltages according to the fans. Generally, the fans can therefore all be supplied by one same electric network or by different networks in terms of network type and/or voltage value.

Advantageously and according to the invention, the ventilation architecture further comprises a duct for evacuating smoke from the helicopter, connected to the mixing chamber.

According to this aspect of the invention, the mixing chamber allows for the addition of additional functionalities, here the evacuation of the smoke, of which the ventilation is made possible by the pooled fans.

The invention also concerns a helicopter, comprising at least two avionics bays comprising electronic equipment, characterised in that it comprises a ventilation architecture of said avionics bays according to the invention.

The invention also concerns a ventilation architecture or a helicopter characterised in combination with all or some of the features mentioned above or below.

5. LIST OF FIGURES

Figure 2:
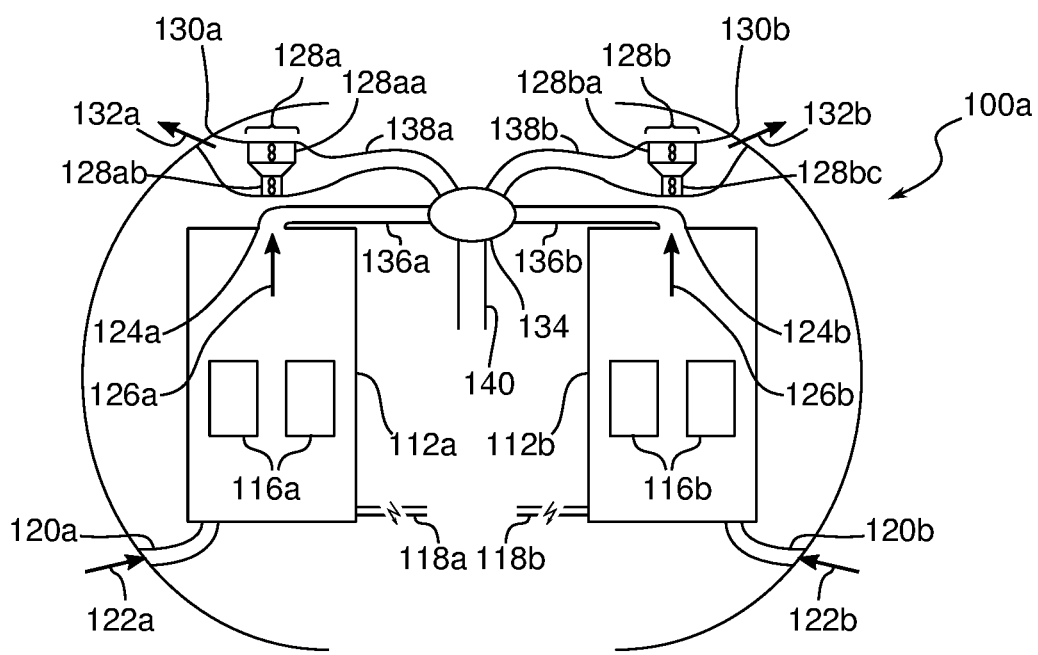
Figure 3:
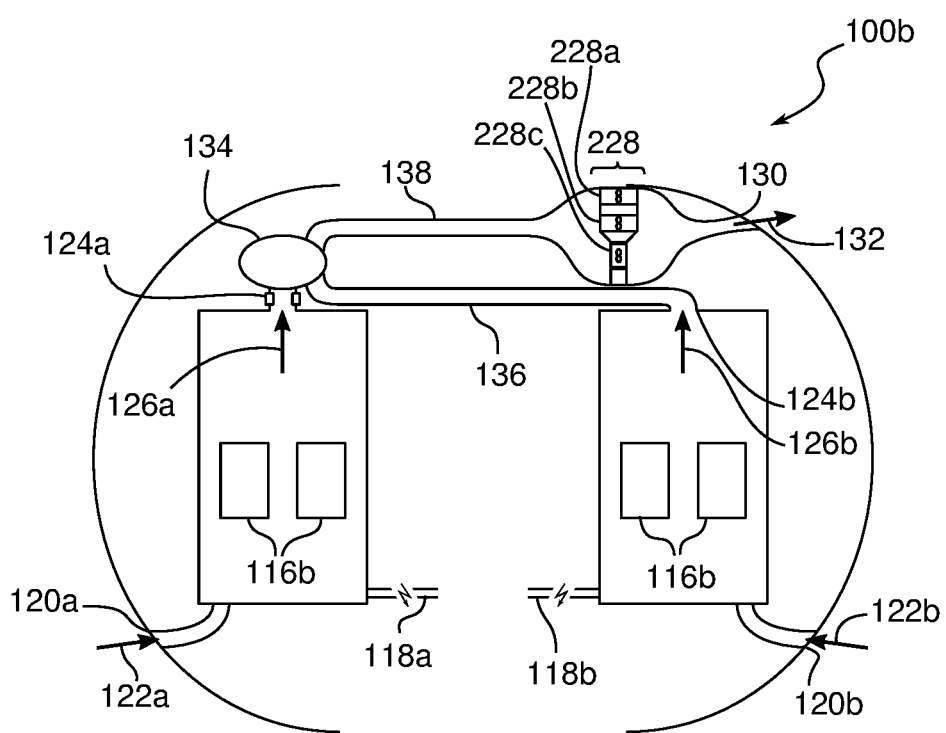

Other aims, features and advantages of the invention will appear upon reading the following description, given only in a non-limiting manner, and which refers to the appended figures, wherein:

FIG. 1 is a schematic, cross-sectional view of a helicopter comprising a ventilation architecture according to the prior art, FIG. 2 is a schematic, cross-sectional view of a helicopter comprising a ventilation architecture according to a first embodiment of the invention, FIG. 3 is a schematic, cross-sectional view of a helicopter comprising a ventilation architecture according to a second embodiment of the invention.

6. DETAILED DESCRIPTION OF AN EMBODIMENT OF THE INVENTION

The following embodiments are examples. Although the description refers to one or more embodiments, this does not necessarily mean that each reference concerns the same embodiment, or that the features apply only to one single embodiment. Single features of different embodiments can also be combined to provide other embodiments. In the figures, the scales and the proportions are not strictly respected, and this, for purposes of illustration and clarity.

FIG. 1 schematically represents, in a cross-section, a helicopter 10 comprising two avionics bays, a first avionics bay 12a and a second avionics bay 12b, ventilated by a ventilation architecture according to the prior art. The helicopter is symbolised by fuselage pieces 14a and 14b.

The avionics bays 12a, 12b comprise electronic and/or electric equipment 16a, 16b to be ventilated, each supplied by a supply 18a, 18b.

To ventilate the avionics bays, the ventilation architecture comprises, for each avionics bay 12a, 12b, an air inlet 20a, 20b allowing the entry of the outside air in the bay, represented by an arrow 22a, 22b.

The outside air enters in the bay and ventilates the electronic equipment 16a, 16b, and emerges from each bay 12a, 12b at the level of an air outlet 24a, 24b as represented by the arrow.

The circulation of the air is made thanks to four independent fans per bay:
- a first assembly 28a comprising four fans, of which two fans 28aa and 28ab supplied with alternating voltage, typically 115V, and two fans 28ac and 28ad supplied with direct voltage, typically 28V;
- a second assembly 28b comprising four fans, of which two fans 28ba and 28bb supplied with alternating voltage, typically 115V, and two fans 28bc and 28bd supplied with direct voltage, typically 28V.

The air passed through by these fans is evacuated to the outside respectively by a first air evacuation outlet 30a for the air ventilating the first avionics bay 12a and a second air evacuation outlet 30b for the air ventilating the second avionics bay 12b, as represented by the arrows 32a and 32b.

The ventilation architecture according to the invention aims to reduce this number of fans. To do this, FIG. 2 schematically represents, in a cross-section, a helicopter 100a each comprising electronic and/or electric equipment 116a, 116b supplied by one supply 118a, 118b per bay, and equipped with a ventilation architecture according to a first embodiment of the invention.

As in the prior art, the ventilation architecture comprises, for each bay, an air inlet 120a, 120b and an air outlet 124a, 124b, the air ventilating the first avionics bay 112a according to the path represented by the arrows 122a and 126a, and the air ventilating the second avionics bay 112b according to the path represented by the arrows 122b and 126b.

According to the invention, the ventilation architecture comprises a mixing chamber 134 connected to the air outlets 124a and 124b and thus receiving air originating from the two avionics bays 112a, 112b. The mixing chamber 134 thus pools the air originating from the two avionics bays 112a, 112b. A first duct 136a connects the air outlet 124a of the first avionics bay 112a to the mixing chamber 134, and a second duct 136b connected the air outlet 124b of the second avionics bay 112b to the mixing chamber 134.

The air entered in the mixing chamber 134 is rejected to the outside at the level of at least one evacuation outlet thanks to at least one air duct. Here, two air ducts 138a, 138b connect the mixing chamber 134 to two air evacuation outlets 130a, 130b, allowing air to return to the outside as represented by the arrows 132a and 132b.

The ventilation of the air of the avionics bays 112a, 112b is ensured by at least two fans, here four fans, divided into two assemblies of fans:
- a first assembly 128a comprising two fans, a fan 128aa supplied with alternating voltage (typically 115V), and a fan 128ab supplied with direct voltage (typically 28V);
- a second assembly 128b comprising two fans, a fan 128ba supplied with alternating voltage (typically 115V), and a fan 128bb supplied with direct voltage (typically 28V).

The suctioning is thus pooled, the two fan assemblies each allowing the ventilation of two avionics bays 112a, 112b thanks to the mixing chamber 134.

In this embodiment, the mixing chamber 134 is also connected to an additional duct allowing another suctioning or ventilation function, for example here a smoke evacuation duct 140 in case of fire in the helicopter.

FIG. 3 schematically represents, in a cross-section, a helicopter comprising a ventilation architecture according to a second embodiment of the invention.

This second embodiment is similar to the first embodiment described in reference to FIG. 2, excluding the fact that the ventilation architecture comprises a mixing chamber 134 arranged as close as possible to the first avionics bay 112a and directly connected to the air outlet 124a of it, and that the ventilation architecture comprises one single air duct 138.

Thus, the fans 228 of the ventilation architecture are grouped together in the single air duct 138. In particular, the ventilation architecture comprises at least two fans, here three fans 228, of which two fans 228a and 228b supplied with alternating voltage (typically 115V) and a fan 228c supplied with direct voltage (typically 28V).

The fans 228 are thus grouped together in the same place, which facilities the maintenance thereof.

A smoke evacuation duct can also be added to this embodiment, connected to the mixing chamber, as well as any other additional duct which could carry out additional suctioning or ventilation functions thanks to the fans and to the mixing chamber.

The invention claimed is:

1. Helicopter ventilation architecture, said helicopter comprising at least two avionics bays comprising electronic equipment to be ventilated, said architecture comprising, for each avionics bay:
    an air inlet, allowing outside air to enter the avionics bay to ventilate said avionics bay,
    an air outlet, allowing air ventilating the avionics bay to exit the avionics bay,
wherein the ventilation architecture further comprises:
    a mixing chamber, connected to the air outlets, configured to receive air originating from all the avionics bays,
    at least one air duct connected to the mixing chamber, and to an air evacuation outlet to the outside,
    at least two fans, arranged and distributed in the air duct(s).

2. Helicopter ventilation architecture according to claim 1, wherein it comprises two air ducts, each air duct comprising at least one fan.

3. Helicopter ventilation architecture according to claim 1, wherein it comprises one single air duct, said single air duct comprising said at least two fans.

4. Helicopter ventilation architecture according to claim 1, wherein it comprises, among the fans, at least one fan supplied with alternating voltage and at least one fan supplied with direct voltage.

5. Helicopter ventilation architecture according to claim 1, wherein it further comprises a smoke evacuation duct of the helicopter, connected to the mixing chamber.

6. Helicopter, comprising at least two avionics bays comprising electronic equipment wherein it comprises a ventilation architecture of said avionics bays according to claim 1.

* * * * *